(12) United States Patent
Basceri et al.

(10) Patent No.: US 7,320,911 B2
(45) Date of Patent: Jan. 22, 2008

(54) METHODS OF FORMING PLURALITIES OF CAPACITORS

(75) Inventors: Cem Basceri, Sterling, VA (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 173 days.

(21) Appl. No.: 11/006,331

(22) Filed: Dec. 6, 2004

(65) Prior Publication Data

US 2006/0121672 A1 Jun. 8, 2006

(51) Int. Cl.
*H01L 21/70* (2006.01)
*H01L 21/8242* (2006.01)

(52) U.S. Cl. .................. 438/239; 438/243; 438/386; 257/E21.648

(58) Field of Classification Search ........ 438/238–396, 438/702
See application file for complete search history.

(56) References Cited

U.S. PATENT DOCUMENTS

| | | | |
|---|---|---|---|
| 5,236,860 A | 8/1993 | Fazan et al. | |
| 5,340,763 A | 8/1994 | Dennison | |
| 5,401,681 A | 3/1995 | Denison et al. | |
| 5,498,562 A | 3/1996 | Dennison et al. | |
| 5,604,696 A | 2/1997 | Takaishi | |
| 5,605,857 A | 2/1997 | Jost et al. | |
| 5,652,164 A | 7/1997 | Dennison et al. | |
| 5,654,222 A | 8/1997 | Sandhu et al. | |
| 5,686,747 A | 11/1997 | Jost et al. | |
| 5,702,990 A | 12/1997 | Jost et al. | |
| 5,705,838 A | 1/1998 | Jost et al. | |
| 5,767,561 A | 6/1998 | Frei et al. | |
| 5,821,140 A | 10/1998 | Jost et al. | |
| 5,900,660 A | 5/1999 | Jost et al. | |
| 5,955,758 A | 9/1999 | Sandhu et al. | |
| 5,981,350 A | 11/1999 | Geusic et al. | |
| 5,990,021 A | 11/1999 | Prall et al. | |
| 6,037,218 A | 3/2000 | Dennison et al. | |

(Continued)

FOREIGN PATENT DOCUMENTS

DE 4447804 1/2002

(Continued)

OTHER PUBLICATIONS

U.S. Appl. No. 11/360,540, filed Feb. 2006, Rana.

(Continued)

*Primary Examiner*—Savitri Mulpuri
(74) *Attorney, Agent, or Firm*—Wells St. John P.S.

(57) ABSTRACT

A method of forming a plurality of capacitors includes providing a plurality of capacitor electrodes comprising sidewalls. The plurality of capacitor electrodes are supported at least in part with a retaining structure which engages the sidewalls, with the retaining structure comprising a fluid previous material. A capacitor dielectric material is deposited over the capacitor electrodes through the fluid previous material of the retaining structure effective to deposit capacitor dielectric material over portions of the sidewalls received below the retaining structure. Capacitor electrode material is deposited over the capacitor dielectric material through the fluid previous material of the retaining structure effective to deposit capacitor electrode material over at least some of the capacitor dielectric material received below the retaining structure. Integrated circuitry independent of method of fabrication is also contemplated.

82 Claims, 11 Drawing Sheets

U.S. PATENT DOCUMENTS

| | | | |
|---|---|---|---|
| 6,110,774 | A | 8/2000 | Jost et al. |
| 6,133,620 | A | 10/2000 | Uochi |
| 6,180,450 | B1 | 1/2001 | Dennison |
| 6,204,143 | B1 | 3/2001 | Roberts et al. |
| 6,204,178 | B1 | 3/2001 | Marsh |
| 6,303,956 | B1 | 10/2001 | Sandhu et al. |
| 6,323,528 | B1 | 11/2001 | Yamazaki et al. |
| 6,383,861 | B1 | 5/2002 | Gonzalez et al. |
| 6,403,442 | B1 | 6/2002 | Reinberg |
| 6,432,472 | B1 | 8/2002 | Farrell et al. |
| 6,458,925 | B1 | 10/2002 | Fasano |
| 6,459,138 | B2 | 10/2002 | Reinberg |
| 6,617,222 | B1 | 9/2003 | Coursey |
| 6,667,502 | B1 * | 12/2003 | Agarwal et al. ............ 257/296 |
| 6,673,693 | B2 | 1/2004 | Kirchhogg |
| 6,709,978 | B2 | 3/2004 | Geusic et al. |
| 6,812,513 | B2 | 11/2004 | Geusic et al. |
| 6,844,230 | B2 | 1/2005 | Reinberg |
| 6,927,122 | B2 | 8/2005 | Geusic et al. |
| 7,042,040 | B2 | 5/2006 | Horiguchi |
| 7,073,969 | B2 | 7/2006 | Kamm |
| 7,074,669 | B2 * | 7/2006 | Iijima et al. ................ 438/253 |
| 7,081,384 | B2 | 7/2006 | Birner et al. |
| 7,084,451 | B2 | 8/2006 | Forbes et al. |
| 7,125,781 | B2 * | 10/2006 | Manning et al. ............ 438/397 |
| 7,179,706 | B2 * | 2/2007 | Patraw et al. ............... 438/253 |
| 2001/0012223 | A1 | 8/2001 | Kohyama |
| 2001/0026974 | A1 | 10/2001 | Reinberg |
| 2002/0030221 | A1 | 3/2002 | Sandhu et al. |
| 2002/0039826 | A1 | 4/2002 | Reinberg |
| 2002/0086479 | A1 | 7/2002 | Reinberg |
| 2002/0090779 | A1 | 7/2002 | Jang |
| 2002/0098654 | A1 | 7/2002 | Durcan et al. |
| 2002/0153614 | A1 | 10/2002 | Ema et al. |
| 2002/0163026 | A1 | 11/2002 | Park |
| 2003/0153146 | A1 | 8/2003 | Won et al. |
| 2003/0178684 | A1 | 9/2003 | Nakamura |
| 2003/0190782 | A1 | 10/2003 | Ko et al. |
| 2003/0227044 | A1 | 12/2003 | Park |
| 2004/0056295 | A1 | 3/2004 | Argarwal |
| 2004/0188738 | A1 * | 9/2004 | Farnworth et al. .......... 257/296 |
| 2005/0158949 | A1 | 7/2005 | Manning |
| 2005/0287780 | A1 | 12/2005 | Manning et al. |
| 2006/0046420 | A1 * | 3/2006 | Manning .................... 438/396 |
| 2006/0051918 | A1 * | 3/2006 | Busch et al. ................ 438/253 |
| 2006/0115951 | A1 * | 6/2006 | Mosley ....................... 438/381 |
| 2006/0121672 | A1 | 6/2006 | Basceri et al. |
| 2006/0186451 | A1 * | 8/2006 | Dusberg et al. ............. 257/306 |

FOREIGN PATENT DOCUMENTS

| | | |
|---|---|---|
| WO | 04/0027898 | 8/2004 |
| WO | 2004/ 027898 | 8/2004 |
| WO | 2004/ 040252 | 12/2004 |
| WO | WO 2005/024936 | 3/2005 |
| WO | 06/06806 | 2/2006 |

OTHER PUBLICATIONS

U.S. Appl. No. 11/580,418, filed Oct. 2006, Raghu et al.
Li, X. and Bohn, P.W., "*Metal-assisted chemical etching in $HF/H_2O_2$ produces porous silicon*", Applied Physics Letters, vol. 77, No. 16, Oct. 16, 2000, pp. 2572-2574.
U.S. Appl. No. 11/083,489, filed Mar. 18, 2005, Sandhu et al.
U.S. Appl. No. 11/131,552, filed May 18, 2005, Manning.
U.S. Appl. No. 11/131,575, filed May 18, 2005, Manning.
U.S. Appl. No. 11/196,593, filed Aug. 2, 2005, Sandhu et al.
U.S. Appl. No. 11/272,232, filed Nov. 10, 2005, Manning et al.
U.S. Appl. No. 11/272,247, filed Nov. 10, 2005, Manning et al.
Kim, D.H. et al., "A Mechanically Enhanced Storage Node for Virtually Unlimited Height (MESH) Capacitor Aiming at Sub 70nm DRAMs", IEEE Jan. 2004, pp. 69-72.
J. P. O'Sullivan et al., *The morphology and mechanism of formation of porous anodic films on aluminium*, Proc. Roy. Soc. Lond. A, vol. 317, pp. 511-543 (1970).
S. Shingubara, *Fabrication of nanomaterials using porous alumina templates*, J. Nanoparticle Res., vol. 5, pp. 17-30 (2003).
S. Tan et al., *High Aspect Ration Microstructures on Porous Anodic Aluminum Oxide*, IEEE, pp. 267-272 (1995).
J: Liang et al., *Nonlithographic Fabrication of Lateral Superlattices for Nanometric Electromagnetic-Optic*. . . IEEE J. Selected Topics in Quantum Electr., vol. 8, No. 5, pp. 998-1008 (Sep./Oct. 2002).
V. V. Konovalov et al., *Chemistry of Materials*, Chem. Mater., vol. 11, No. 8, pp. 1949-1951 (Aug. 1999).
J. Masuda et al., *Highly ordered nanochannel-array architecture in anodic alumina*, App. Phys. Lett, vol. 71, No. 19, pp. 2770-2772 (Nov. 1997).
D. Crouse et al., *Self-Assembled Nanostructures Using Anodized Alumina Thin Films for Optoelectronic Applications*, IEEE, pp. 234-235 (1999).
A. Nadeem et al., *Fabrication of Microstructures Using Aluminum Anodization Techniques*, pp. 274-277 (pre-2004).
C. Y. Liu et al., *Ordered anodic alumina nanochannels on focused-ion-beam-prepatterned aluminum surfaces*, Appl. Phys. Lett., vol. 78, No. 1, pp. 120-122 (Jan. 2001).
PCT/US2004/027898; Filed: Aug. 26, 2004; PCT Search Report mailed Feb. 28, 2005; 4 pp.
"Novel Robust Cell Capacitor (Leaning Exterminated Ring Type Insulator) And New Storage Node Contact (Top Spacer Contact) For 70nm DRAM Technology And Beyond"; Park et al.; 2004 Symposium on VLSI Technology Digest of Technical Papers; Jul. 2004; pp. 34-35.
Banhart, *Aluminum Foams: On the Road to Real Applications*, MRS Bulletin, pp. 290-295 (Apr. 2003).
Gibson et al., *Cellular Solids*, MRS Bulletin, pp. 270-274 (Apr. 2003).
Green et al., *Cellular Ceramics: Intriguing Structures, Novel Properties, and Innovative Applications*, MRS Bulletin, pp. 296-300 (Apr. 2003).
U.S. Appl. No. 10/656,732, filed Sep. 2003, Manning.
U.S. Appl. No. 10/733.181, filed Dec. 2003, Manning et al.
U.S. Appl. No. 10/894,633, filed Jul. 2004, Manning.
U.S. Appl. No. 10/928,931, filed Aug. 2004, Busch et al.
U.S. Appl. No. 10/929,037, filed Aug. 2004, Manning.
Green et al., *The Structural and Applications of Cellular Ceramics*, Web Extra, 10 pages (Apr. 2003).
Karp et al., *Scaffolds for Tissue Engineering*, MRS Bulletin, pp. 301-306 (Apr. 2003).
Kraynik, *Foam Structure: From Soap Froth to Solid Foams*, MRS Bulletin, pp. 275-276, (Apr. 2003).
Maire et al., *In Situ X-Ray Tomography Measurements of Deformation in Cellular Solids*, MRS Bulletin, pp. 284-289 (Apr. 2003).
Oh et al., *Preparation and Pore-Characteristics Control of Nano-Porous Materials Using Organometallic Building Blocks*, 4 Carbon Science, No. 1, pp. 1-9 (Mar. 2003).
Onck, *Scale Effects in Cellular Metals*, MRS Bulletin, pp. 279-283 (Apr. 2003).
Park et al., *Block Copolymer Lithography: Periodic Arrays of ~$10^{11}$ Holes in 1 Square Centimeter*, 276 Science, pp. 1401-1404 (May 30, 1997).
Tsukada et al., *Preparation and Application of Porous Silk Fibroin Materials*, 54 Journal of Applied Polymer Science, pp. 507-514 (1994).

\* cited by examiner

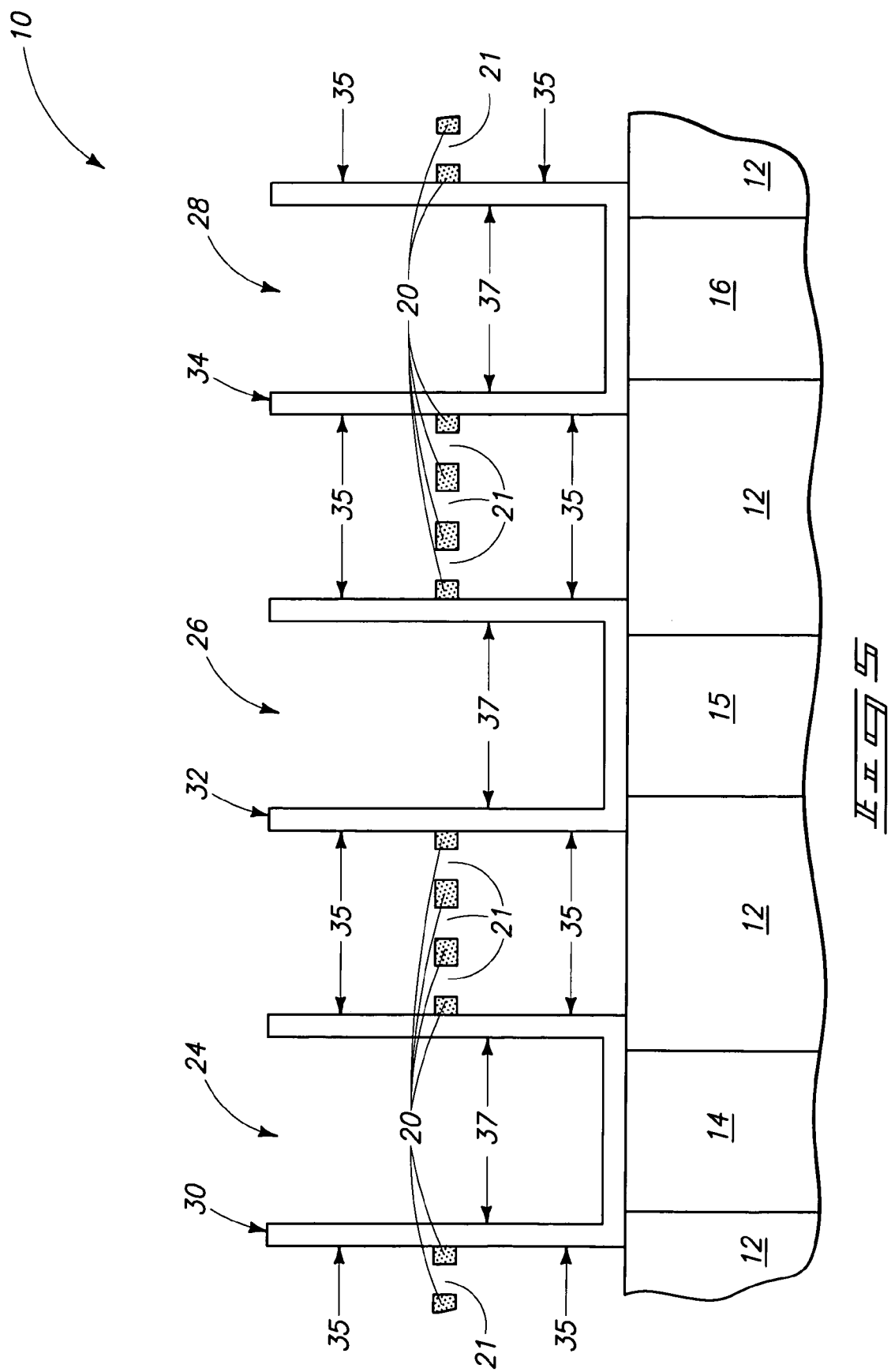

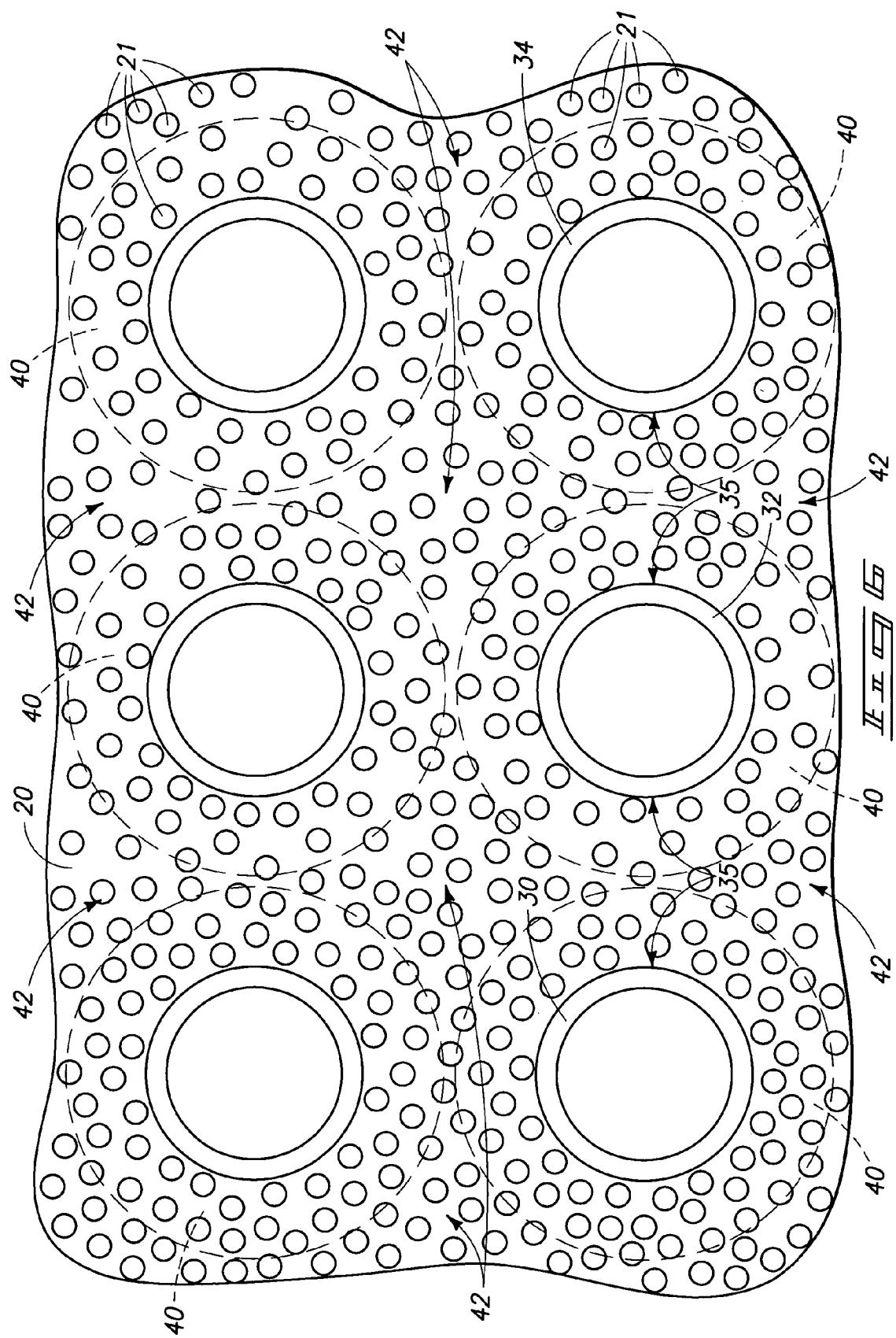

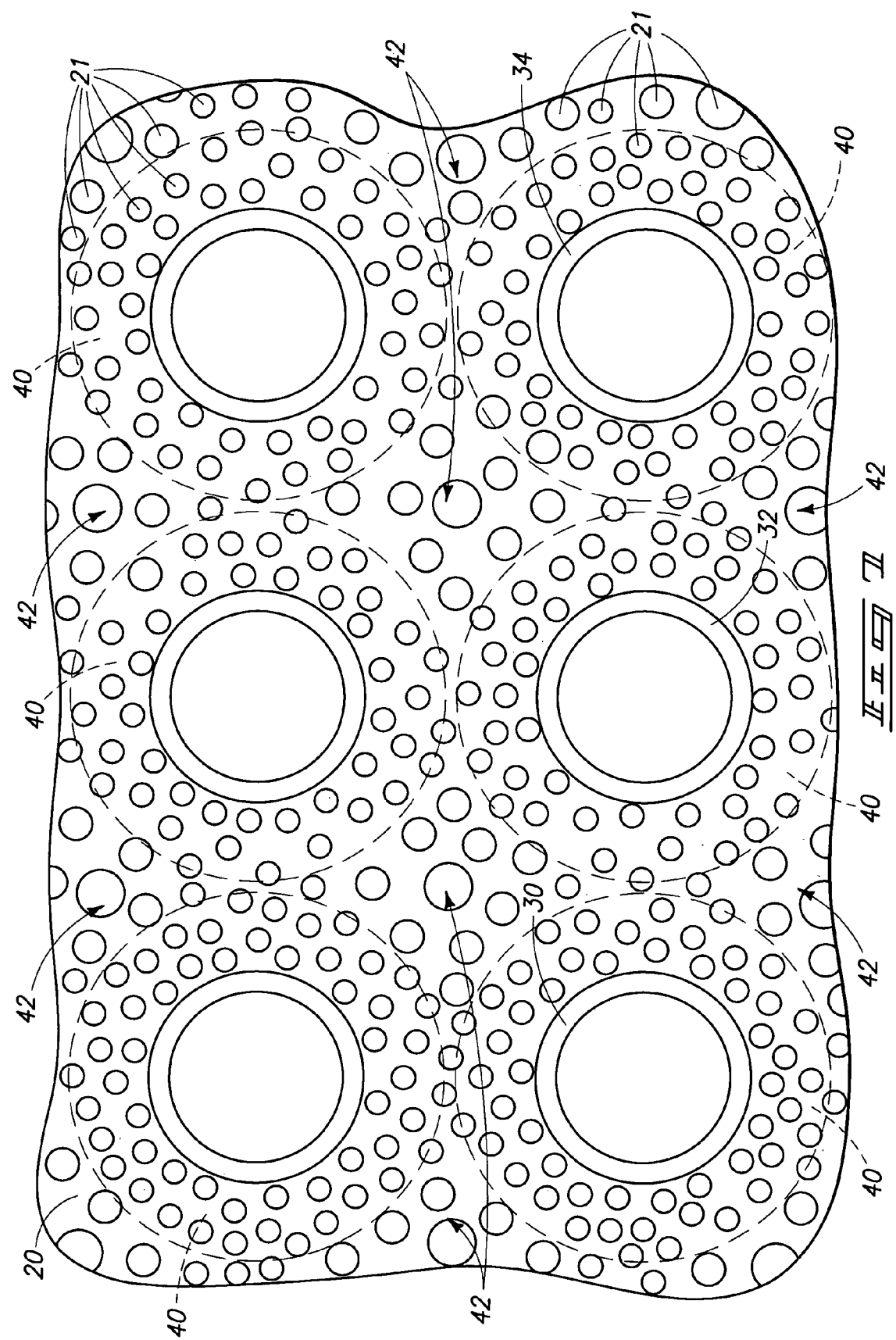

METHODS OF FORMING PLURALITIES OF CAPACITORS

TECHNICAL FIELD

This invention relates to methods of forming pluralities of capacitors, and to integrated circuitry.

BACKGROUND OF THE INVENTION

Capacitors are one type of component which is commonly used in the fabrication of integrated circuits, for example in DRAM circuitry. A typical capacitor is comprised of two conductive electrodes separated by a non-conducting dielectric region. As integrated circuitry density has increased, there is a continuing challenge to maintain sufficiently high storage capacitance despite typical decreasing capacitor area. The increase in density of integrated circuitry has typically resulted in greater reduction in the horizontal dimension of capacitors as compared the vertical dimension. In many instances, the vertical dimension of capacitors has increased.

One manner of forming capacitors is to initially form an insulative material within which a capacitor storage node electrode is formed. For example, an array of capacitor electrode openings for individual capacitors is typically fabricated in such insulative capacitor electrode-forming material, with a typical insulative electrode-forming material being silicon dioxide doped with one or both of phosphorus and boron. The capacitor electrode openings are typically formed by etching. However, it can be difficult to etch the capacitor electrode openings within the insulative material, particularly where the openings are deep.

Further and regardless, it is often desirable to etch away most if not all of the capacitor electrode-forming material after individual capacitor electrodes have been formed within the openings. Such enables outer sidewall surfaces of the electrodes to provide increased area, and thereby increased capacitance for the capacitors being formed. However, the capacitor electrodes formed in deep openings are typically correspondingly much taller than they are wide. This can lead to toppling of the capacitor electrodes either during the etch to expose the outer sidewall surfaces, during transport of the substrate, and/or during deposition of the capacitor dielectric layer or outer capacitor electrode layer. Our U.S. Pat. No. 6,667,502 teaches provision of a brace or retaining structure intended to alleviate such toppling.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

The invention comprises methods of forming pluralities of capacitors, and comprises integrated circuitry independent of method of fabrication. In one implementation, a method of forming a plurality of capacitors includes providing a plurality of capacitor electrodes comprising sidewalls. The plurality of capacitor electrodes is supported at least in part with a retaining structure which engages the sidewalls, with the retaining structure comprising a fluid previous material. A capacitor dielectric material is deposited over the capacitor electrodes through the fluid previous material of the retaining structure effective to deposit capacitor dielectric material over portions of the sidewalls received below the retaining structure. Capacitor electrode material is deposited over the capacitor dielectric material through the fluid previous material of the retaining structure effective to deposit capacitor electrode material over at least some of the capacitor dielectric material received below the retaining structure.

In one implementation, a method of forming a plurality of capacitors includes depositing a first material over a substrate. A fluid previous material is deposited over the first material, with the first material being selectively etchable relative to the fluid previous material. A plurality of spaced capacitor electrode openings is formed into the first and fluid previous materials. A plurality of capacitor electrodes is formed within the openings. After forming the plurality of capacitor electrodes, an etching fluid is flowed through the fluid previous material effective to selectively etch first material relative to the fluid previous material and effective to expose outer lateral sidewalls of the capacitor electrodes below the fluid previous material. After the selective etch, capacitor dielectric material and capacitor electrode material are deposited over at least some of the outer lateral sidewalls below the fluid previous material exposed by the selective etch.

In one implementation, integrated circuitry comprises a plurality of spaced, elongated and upright capacitor electrodes received over a substrate and supported at least in part by a sidewall retaining structure. The sidewall retaining structure comprises a fluid previous material.

In one implementation, integrated circuitry comprises a plurality of spaced, elongated and upright capacitor electrodes received over a substrate and supported at least in part by a sidewall retaining structure. The sidewall retaining structure comprises at least one of nanowhiskers and nanotubes.

Other implementations and aspects are contemplated.

BRIEF DESCRIPTION OF THE DRAWINGS

Preferred embodiments of the invention are described below with reference to the following accompanying drawings.

FIG. 5 is a view of the FIG. 4 substrate at a processing step subsequent to that shown by FIG. 4.

FIG. 6 is a diagrammatic top plan view of the FIG. 5 substrate.

FIG. 7 a view of the FIG. 6 substrate at a processing step subsequent to that shown by FIG. 6.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
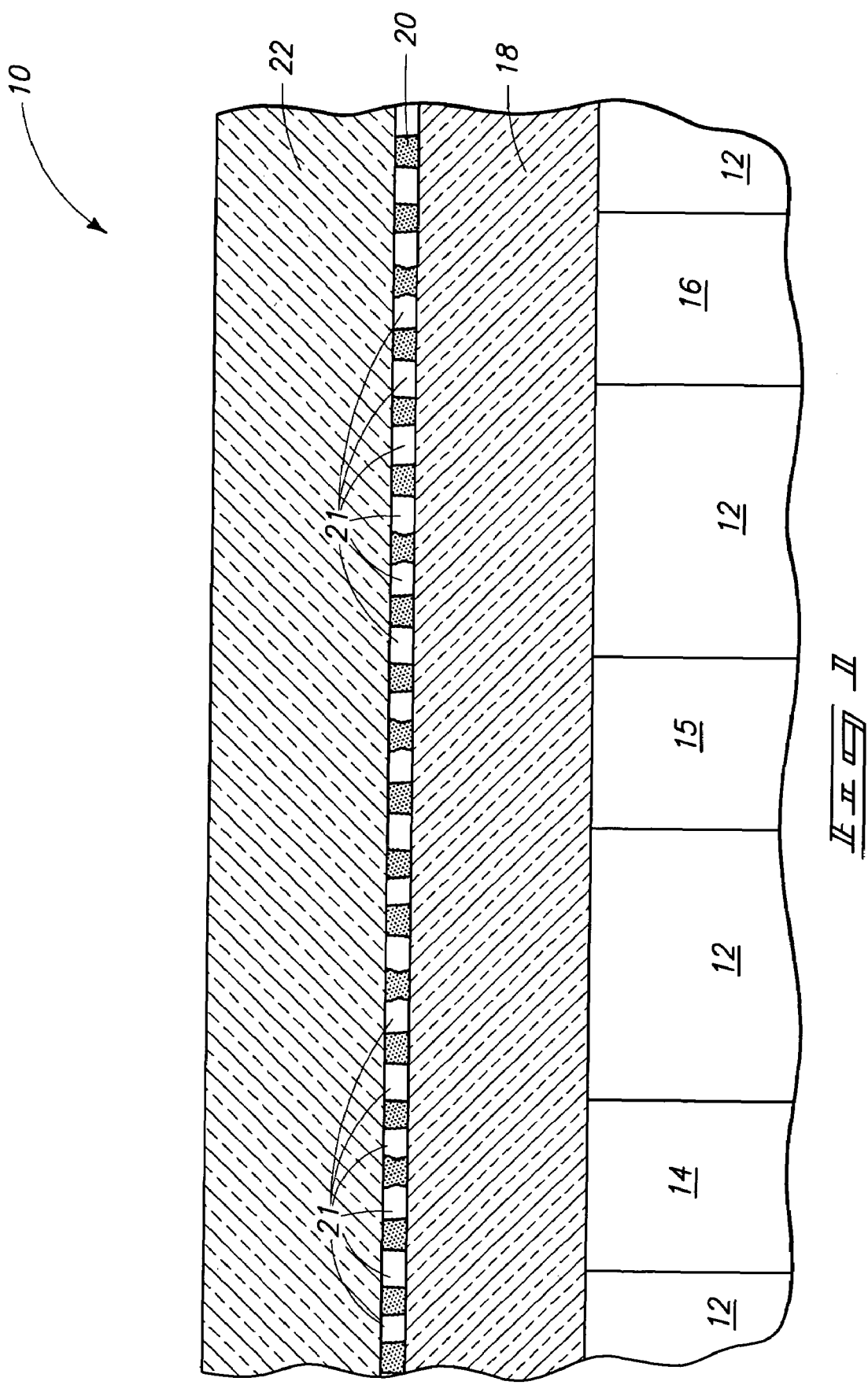
FIG. 1 is a diagrammatic cross section of a substrate fragment in process in accordance with an aspect of the invention.

Integrated circuitry and methods of forming pluralities of capacitors in accordance with exemplary preferred embodiments of aspects of the invention are described with reference to FIGS. 1-11. Referring initially to FIG. 1, a wafer fragment is indicated generally with reference numeral 10, and in one preferred implementation comprises a semiconductor substrate. In this document, "semiconductive substrate" or "semiconductor substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. By way of example only, substrate fragment 10 is depicted as comprising some insulator layer 12 having a plurality of conductive contact plugs 14, 15 and 16 formed therein for electrical connection with respect to capacitor electrodes of a plurality of capacitors being formed, as will be apparent from the continuing discussion. Insulative material 12 would overlie other substrate material (not shown), for example bulk monocrystalline silicon, semiconductor-on-insulator circuitry, or other substrate material (of course including one or a plurality of materials) whether existing or yet-to-be developed. Further and by way of example only, an etch stop layer (not shown) might be received over constructions 12/14/15/16, as a part of material 12, and/or proximate the upper portions of constructions 14/15/16. Conductive plugs 14, 15 and 16 will comprise one or more conductive materials including, for example and by way of example only, conductively doped semiconductive material. Material 12 might comprise any suitable insulator material, for example one or more silicon dioxides, silicon nitrides, and/or other materials, and of course whether existing or yet-to-be developed. Substrate 12/14/15/16, is exemplary only, and any substrate is contemplated.

A first material 18 has been deposited over substrate 12/14/15/16. First material 18 might be conductive, insulative or semiconductive, with an insulative material being preferred. By way of example only, exemplary preferred materials include silicon dioxides, for example doped silicon dioxides, and including boron and phosphorus-doped silicon dioxides (i.e., PSG, BSG, and/or BPSG, and spin-on-glasses). An exemplary preferred thickness range for layer 18 is from 5,000 Angstroms to 10,000 Angstroms.

In one implementation, a fluid previous material 20 has been deposited over first material 18, and preferably on first material 18 (with "on" in this document meaning in at least some direct physical contact therewith). An exemplary preferred thickness range for fluid previous material 20 is from 500 Angstroms to 1,000 Angstroms. In one implementation, fluid previous material 20 is characterized by being different from first material 18 and such that first material 18 is selectively etchable relative to fluid previous material 20. In the context of this document, a material which is selectively etchable relative to another requires capability of a selective etch rate of at least 10:1 of removal rate of the one material relative the another material.

Further in the context of this document, a "fluid previous material" is any material through which a fluid (or course, including reactive gases) can be caused indiscriminately to flow without any required patterning or selective deposit of such material over a substrate to enable such flow therethrough (although such might selectively deposit, or be subsequently patterned). Such fluid previous material might be inherently fluid previous as-deposited, or rendered fluid previous after deposition such that fluid can flow through such material. However, a fluid previous material herein does not include a material which is not fluid previous as-deposited but subsequently allows fluid flow only upon a subsequent patterning of a mask followed by subsequent etch of all unmasked portions such that fluid permeability therethrough results only from fluid flow around patterned islands or patterned isolated regions of such material. By way of example only, exemplary preferred fluid previous materials comprise cellular solids, for example comprising an assembly of prismatic or polyhedral cells having solid edges and faces packaged together to fill space. For example, such cellular solid material might comprise a honeycomb or comprise a foam and include, by way of example only, cellular metals, cellular ceramics, aluminum and other metal foams, glasses, polymers, etc. Further and regardless, in one preferred implementation, the fluid previous material is porous, and even more preferably nanoporous. In the context of this document, "nano" as a word prefix denotes average size on the order of less than or equal to 100 nanometers. Accordingly, a "nanoporous" material has overall average pore size of 1000 Angstroms or less. Exemplary preferred fluid previous materials are low k materials, and as well silk fibroin material, and porous SiLK™ available from Dow Chemical.

In one preferred implementation, fluid previous material 20 comprises nanowhiskers, with "nanowhiskers" being synonymous with and common to nanowires and nanorods. Such are nano-scale in diameter, can reach tens of microns in length, and can be grown from a variety of different materials, as known by people of skill in the art. By way of example only, exemplary nanowhisker material includes $Si_3N_4$, Si, Ge, SiC, $B_4C$, GaN, B, $TiO_x$, and metal carbides. Further by way of example only, the fluid previous material might comprise nanotubes, by way of example only carbon nanotubes. Of course, the fluid previous material might comprise a combination of nanowhiskers and nanotubes, and/or combinations of the above variously stated materials, and other materials. For example and by way of example only, one preferred manner of providing nanowhiskers and/or nanotubes would be to provide one or both of nanowhiskers and nanotubes within a spin-on-glass solution. Such solution would be deposited over first material 18. Such solution would be solidified into an exemplary material 20 comprising spin-on-glass and one or both of nanowhiskers and nanotubes.

Further and regardless, fluid previous material 20 will effectively define or have fluid passageways essentially extending therethrough to allow fluid to pass from one side of material 20 to the other. By way of example only, such are diagrammatically depicted with numerals 21 in FIG. 1. Also by way of example only, such might comprise interconnected pores or other small interconnected chambers or channels which serpentine from one surface of material 20 to the other. Further, collectively such may be of substantially common or varying open cross-sectional shape and dimensions across material 20, and/or of common or varying open cross-sectional shape of an individual passageway 21. Such can be substantially vertically oriented or perpendicular relative to the expanse of material 20 as diagrammatically shown. In one preferred implementation, at least a majority of such fluid passageways within fluid previous material 20 have average open cross-sectional dimensions for fluid flow therethrough which are no greater than 400 Angstroms, and in one preferred embodiment no greater than 200 Angstroms. Preferably, at least the same majority of fluid passageways within fluid previous material 20 have average open cross-sectional dimensions of at least 50 Angstroms. By way of example only, exemplary preferred ranges for said open cross-sectional dimensions are from 100 Angstroms to 400 Angstroms, from 100 Angstroms to 300 Angstroms, and from 100 Angstroms to 200 Angstroms.

Still referring to FIG. 1, a second material 22 has been deposited over fluid previous material 20, and preferably on fluid previous material 20 as shown. Second material 22 is preferably characterized as being selectively etchable relative to fluid previous material 20, and thereby different therefrom. First material 18 and second material 22 might be the same (meaning identical composition) or different materials. Further for example if different, such might both comprise oxides, for example any combinations of doped or undoped oxides including PSG, BSG, BPSG, and spin-on-glasses, by way of example only. Further of course by way of example only, materials 18 and 22 might comprise the same oxide. An exemplary preferred thickness range for second material 22 is from 5,000 Angstroms to 15,000 Angstroms. An exemplary preferred composite thickness range for materials 18, 20 and 22 in combination in FIG. 1 is from 10,000 Angstroms to 25,000 Angstroms. Further and regardless, second material 22 might fill at least some portion of some of fluid passageways 21, might fill substantially all of at least some of fluid passageways 21, or substantially fill all of at least a majority of passageways 21 (not shown).

Figure 2:
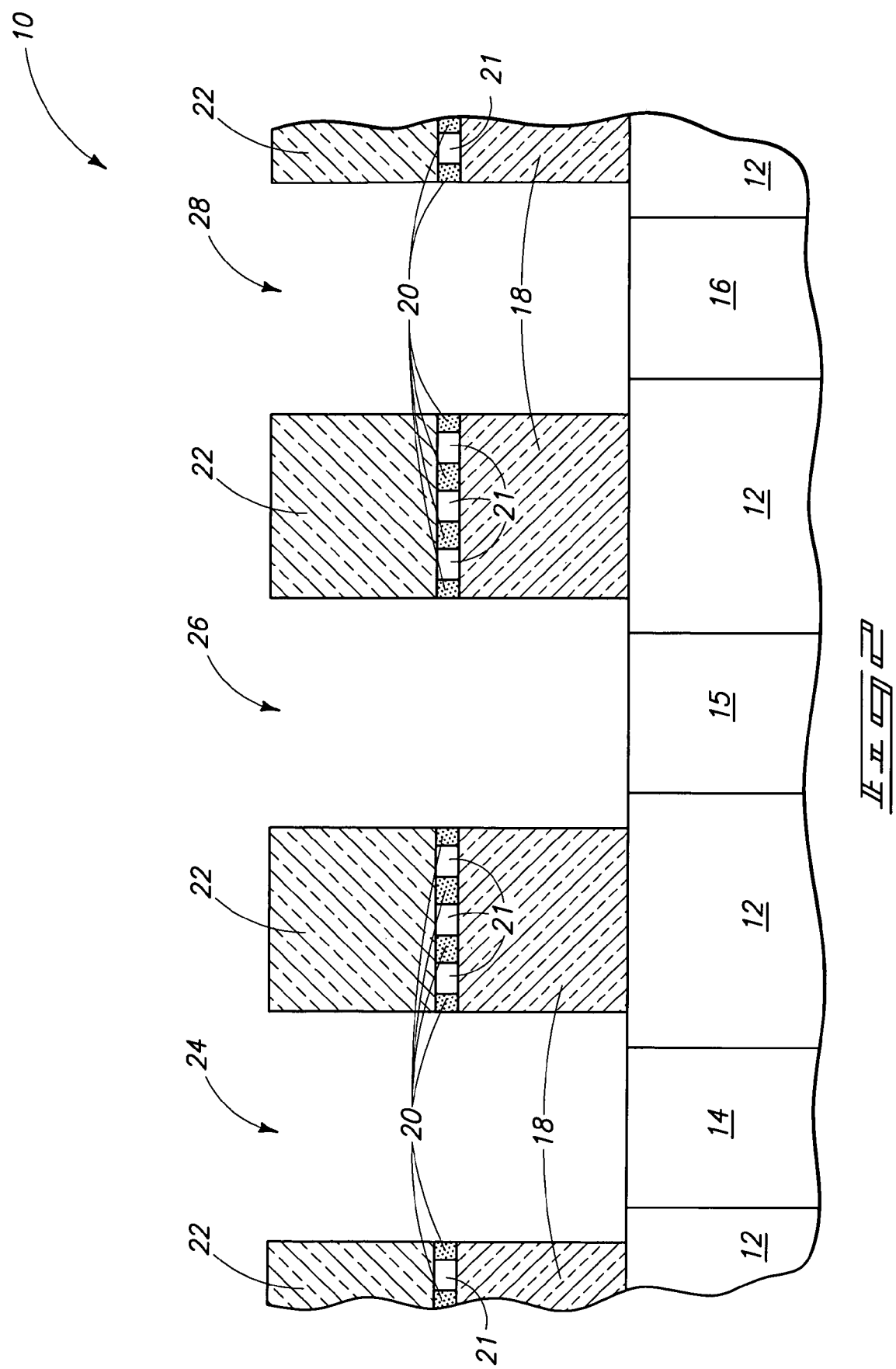
FIG. 2 is a view of the FIG. 1 substrate at a processing step subsequent to that shown by FIG. 1.

Referring to FIG. 2, a plurality of spaced capacitor electrode openings 24, 26 and 28 have been formed into first, fluid previous, and second materials 18, 20 and 22, respectively. An exemplary preferred technique for the same is by photolithographic patterning and subsequent anisotropic chemical etching. Of course in the depicted preferred implementation, etching chemistry will likely need to be changed at least twice when switching from etching material 22 to etching material 20, and again when subsequently etching material 18. Regardless, it is likely (but not required) that the number of passageways/pores/etc. intermediate adjacent of the openings might be greater in number than that shown in the drawings, with three being shown between adjacent of the openings for clarity in the figures.

Figure 3:
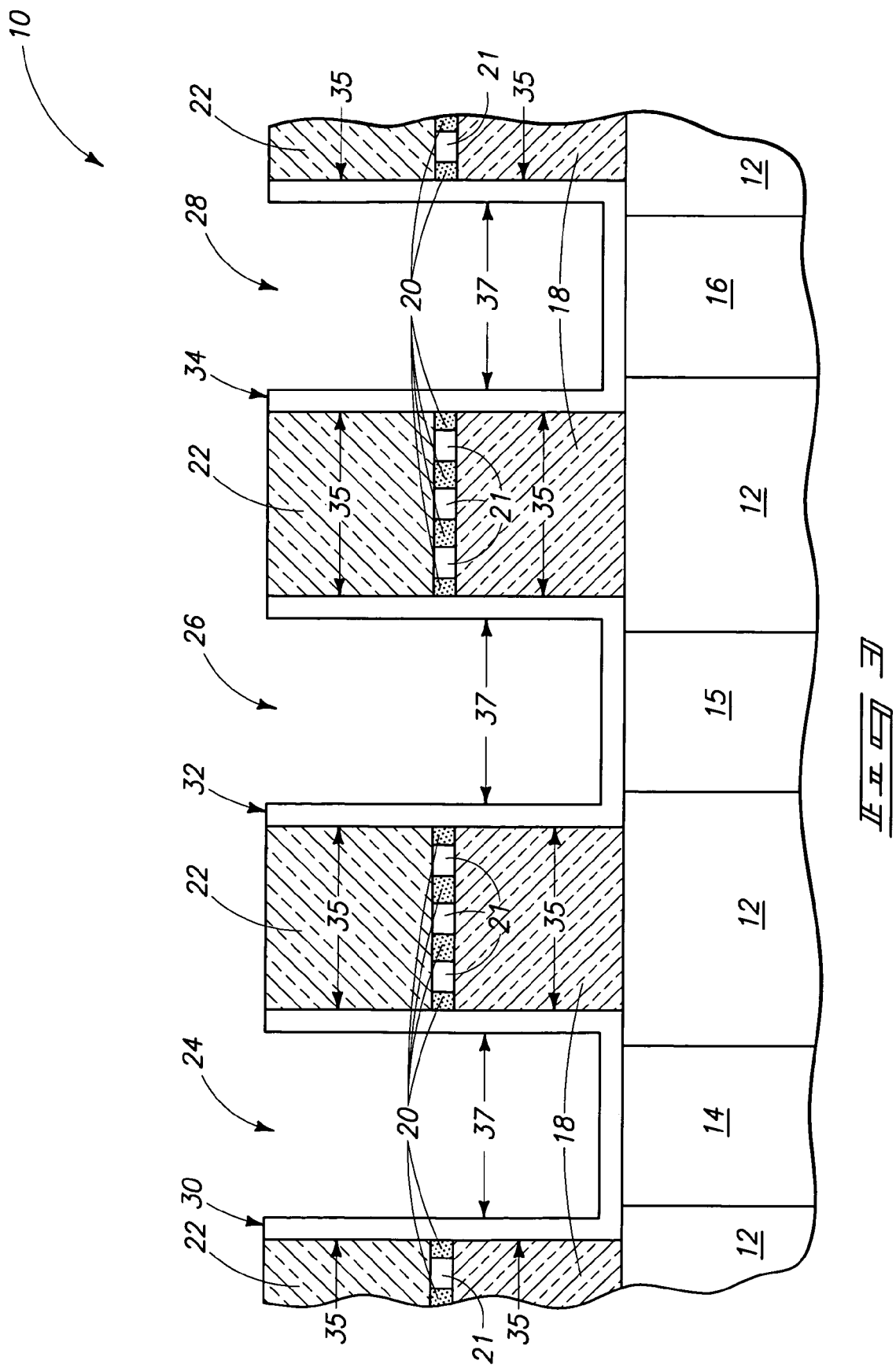
FIG. 3 is a view of the FIG. 2 substrate at a processing step subsequent to that shown by FIG. 2.

Referring to FIG. 3, a plurality of capacitor electrodes 30, 32 and 34 have been formed within openings 24, 26 and 28. In the depicted preferred embodiment, individual of such capacitor electrodes respectively comprise a respective container shape. By way of example only, an exemplary preferred material for capacitor electrodes 30, 32 and 34 is conductively doped polysilicon. An exemplary manner of forming the same is by polysilicon deposition followed by maskless chemical mechanical polishing to form the depicted isolated capacitor electrodes 30, 32 and 34. Such are depicted as having sidewalls 35 and 37, with sidewalls 37 comprising inner container sidewalls and sidewalls 35 comprising outer lateral sidewalls. Of course and by way of example only, but less preferred, openings 24, 26 and 28 might be completely filled with capacitor electrode material such that an individual electrode is more of a filled-in pillar shape than a container shape, and perhaps void of inner container sidewalls 37. Further and accordingly in the depicted example, at least sidewalls 35 of capacitor electrodes 30, 32 and 34 are depicted as including portions received both above and below fluid previous material 20.

Figure 4:
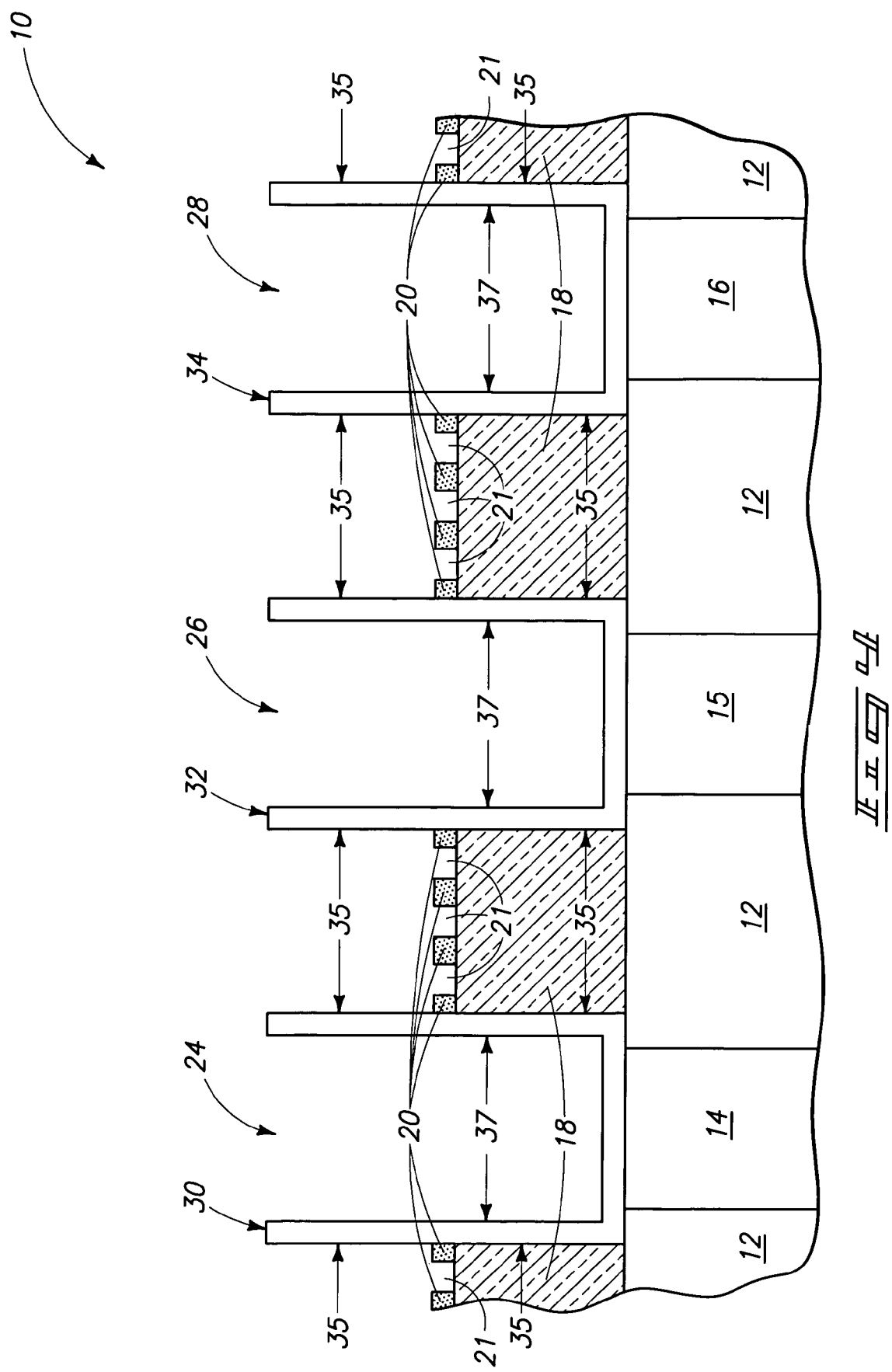
FIG. 4 is a view of the FIG. 3 substrate at a processing step subsequent to that shown by FIG. 3.

Referring to FIG. 4, second material 22 has been etched selectively relative to fluid previous material 20 effective to expose outer lateral sidewalls 35 of capacitor electrodes 30, 32 and 34 received above fluid previous material 20.

Referring to FIG. 5, an etching fluid has been flowed through fluid previous material 20 effective to selectively etch first material 18 relative to fluid previous material 20 and effective to expose outer lateral sidewall 35 of capacitor electrodes 30, 32 and 34 received below fluid previous material 20. Of course if first material 18 and second material 22 are the same or at least capable of being etched with the same chemistry selectively relative to fluid previous material 20, the processing of FIG. 5 could be a continuing of the etching of FIG. 4, for example utilizing the same etching chemistry and etching fluid, and for example in a single common continuous etching step. In one preferred methodical aspect of the invention, fluid previous material 20 supports capacitor electrodes 30, 32 and 34 upright during the selective etch of at least first material 18.

In one implementation of an aspect of the invention, a method of forming a plurality of capacitors comprises providing a plurality of capacitor electrodes comprising sidewalls. Such plurality of capacitor electrodes are supported at some point at least in part with a retaining structure which engages the sidewalls and comprises a fluid previous material. For example and by way of example only, FIG. 5 depicts such an exemplary retaining structure in the form of remnant material 20. Such retaining structure 20 in the depicted embodiment is formed of a single layer of material. Of course, multiple layers of materials might be utilized whether contacting one another or not. For example and by way of example only, the retaining structure might comprise multiple spaced layers of material 20. Further by way of example only, the preceding discussion with reference to FIGS. 1-4 provides only exemplary methods of forming such plurality of capacitor electrodes and supporting such at least in part with a retaining structure which engages (not necessarily directly contacting) the capacitor electrode sidewalls. However, the structure of FIG. 5, or any other structure as just so stated, in a method of supporting with a retaining structure as just so stated are also contemplated.

As described above, fluid previous material 20 might be inherently fluid previous as-deposited, or rendered fluid previous after deposition. For example and by way of example only, any of the above preferred materials, for example foams, honeycombs and/or other materials, might be deposited in a manner which provides fluid permeability therethrough immediately upon formation. Alternately by way of example only, processing might be provided subsequently to a deposited material 20 to render it fluid previous. For example and by way of example only, a suitably thin silicon nitride or other layer might be physically bombarded with ions or suitably small solid material to create indiscriminate perforations (for example, much like bullet holes) through material 20 to render such material indiscriminately fluid previous while retaining continuity of material as a continuous preferred retaining structure or support in the preferred processing as described above.

Further and regardless, the invention contemplates an increasing of degree of fluid permeability of at least some of the fluid previous material from its as-deposited state. In one exemplary implementation, such might be done to different degrees relative to different regions. For example in one aspect, the invention contemplates increasing, from the as-deposited state, the degree of fluid permeability of first regions of fluid previous material that are spaced farther from the sidewalls of the capacitor electrodes as compared to second regions of fluid previous material that are spaced closer to the capacitor electrode sidewalls. By way of example only, such is depicted with reference to FIGS. 6 and 7. FIG. 6 diagrammatically depicts a top view of FIG. 5 showing an exemplary degree of porosity and/or fluid passageway density and average diameter of fluid previous material 20 as-deposited. Such can be considered as depicting exemplary second regions 40 of fluid previous material that are spaced more proximate or closer to sidewalls 35 of the capacitor electrodes as compared to first regions 42 which are comparatively spaced further from sidewalls 35 of the capacitor electrodes.

FIG. 7 depicts subsequent processing whereby fluid passageways 21 within regions 42 have been widened on average as compared to fluid passageways 21 within regions 40 on average, thereby increasing the degree of fluid permeability of material 20 within first regions 42 as compared to second regions 40. An exemplary manner of producing the FIG. 7 construction as compared to that of FIG. 6 is by suitable plasma etching, which will tend to inherently preferentially widen pores or passageways spaced further from sidewalls 35 of adjacent structures than those which are placed closer to such structures.

Figure 8B:
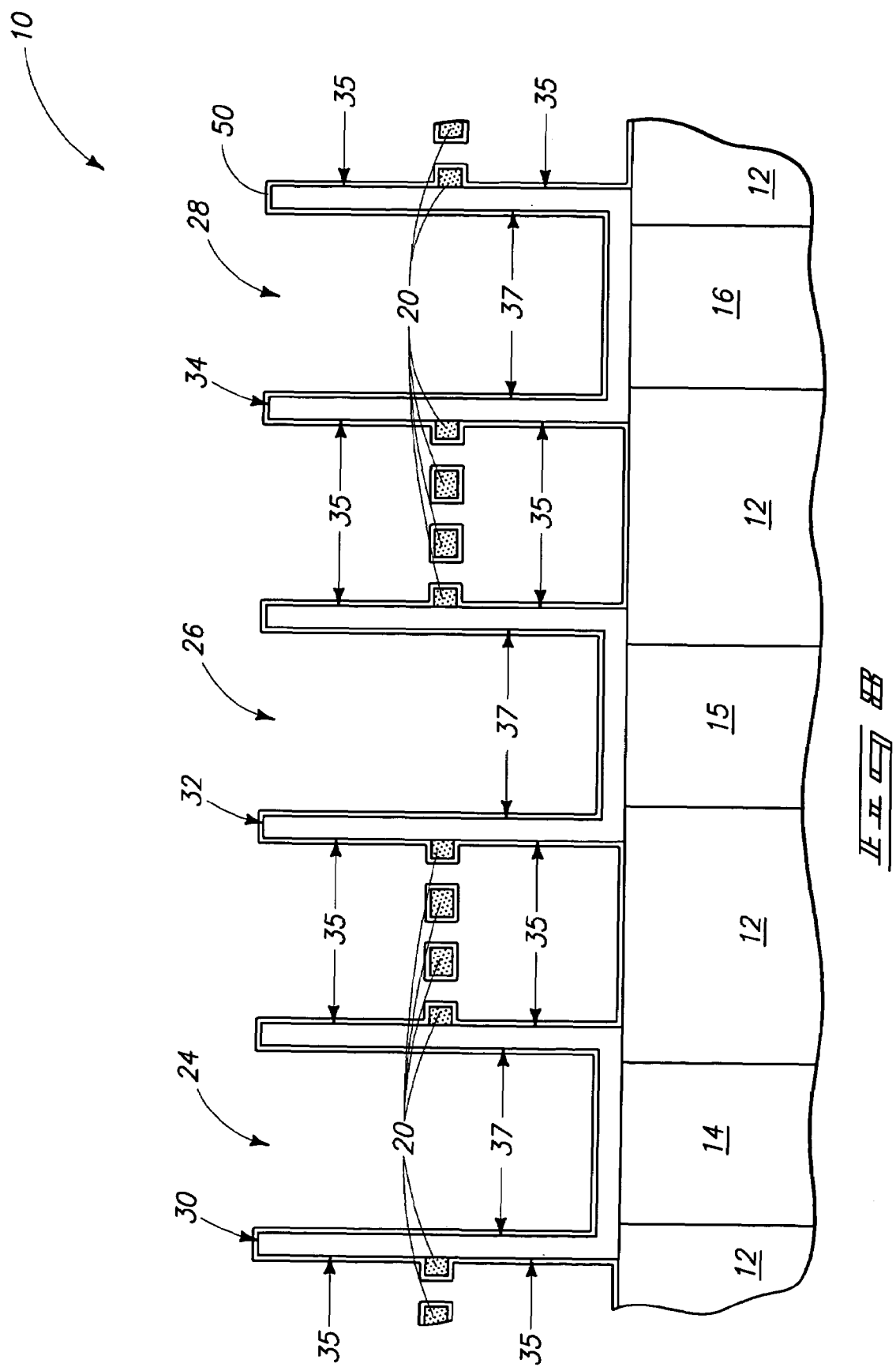
FIG. 8 is a view of the FIG. 5 substrate at a processing step subsequent to that shown by FIG. 5.

Referring to FIG. 8, a capacitor dielectric material 50 has been deposited over at least some of outer lateral sidewalls 35 above and below fluid previous material 20. In one preferred implementation, capacitor dielectric material 50 has at least been deposited over capacitor electrodes 30, 32 and 34 through fluid previous material 20 of the FIG. 5 depicted retaining structure 20 effective to deposit capacitor dielectric material 50 at least over portions of the capacitor sidewalls which are received below the retaining structure. Further likely, unless deposition conditions were selected that would be selective to not deposit material 50 onto retaining structure/fluid previous material 20, capacitor dielectric material 50 would also deposit onto material 20, and most likely within the fluid passageways effectively formed therethrough, and as shown. An exemplary preferred material 50 is aluminum oxide, with an exemplary preferred thickness for material 50 being 40 Angstroms. Minimum passageway size in material 20 is preferably selected to be greater than two times the deposition thickness of material 50 at least to preclude occlusion of such passageways with the depositing capacitor dielectric material to enable such material to deposit onto sidewalls of the electrodes below fluid previous material 20. For example, and by way of example only, a preferred minimum open cross-dimension for passageways 21 for a 40 Angstrom thick capacitor dielectric layer 50 is 120 Angstroms. Of course alternately by way of example only, non-uniform minimum cross-dimension fluid passageways might be provided in fluid previous material 20. Further for example and by way of example only and with respect to the FIG. 7 depiction, deposited capacitor dielectric material 50 might block or occlude fluid permeability in at least a majority, if not all, of second regions 40 and not do so in at least a majority, and perhaps in none, of first regions 42.

Figure 9:
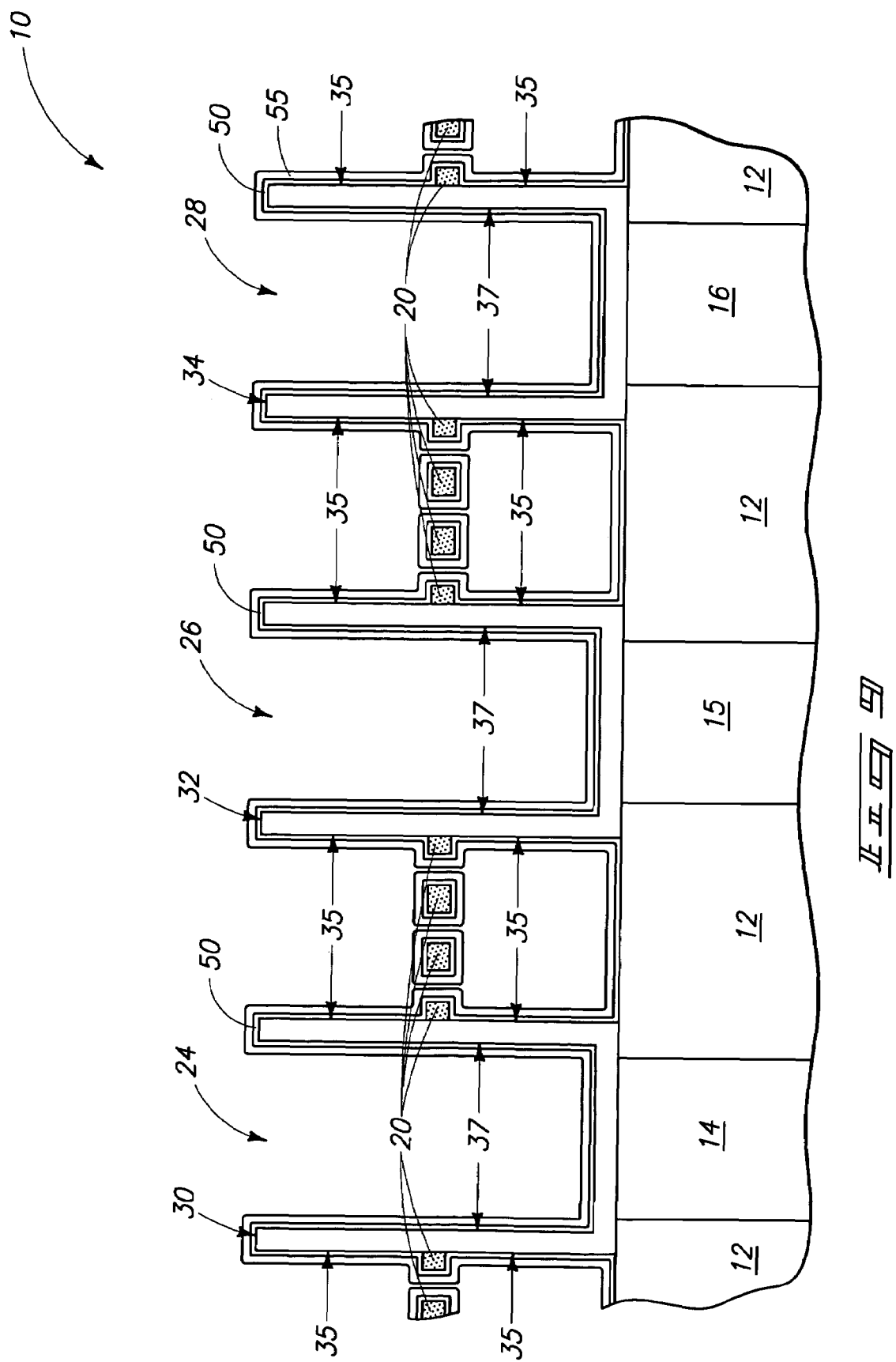
FIG. 9 is a view of the FIG. 8 substrate at a processing step subsequent to that shown by FIG. 8.

Referring to FIG. 9, capacitor electrode material 55 has been deposited over at least some of outer lateral sidewalls 35 above and below fluid previous material 20, and accordingly in one preferred implementation at least over at least some of capacitor dielectric material 50 received below retaining structure 20. Material 55 will ultimately be conductive, and may constitute the same or different material(s) from that of first capacitor electrodes 30, 32 and 34. Second capacitor electrode material 55 might be patterned to form individual second capacitor electrodes for the depicted first capacitor electrodes, or alternately by way of example only comprise a single common capacitor electrode for all of the depicted capacitors, as is common in DRAM circuitry for example. Further and regardless, retaining structure/fluid previous material 20 might or might not remain as part of a finished integrated circuitry construction incorporating the plurality of capacitors, with such being depicted as remaining as part of such construction in FIG. 9.

Figure 10:
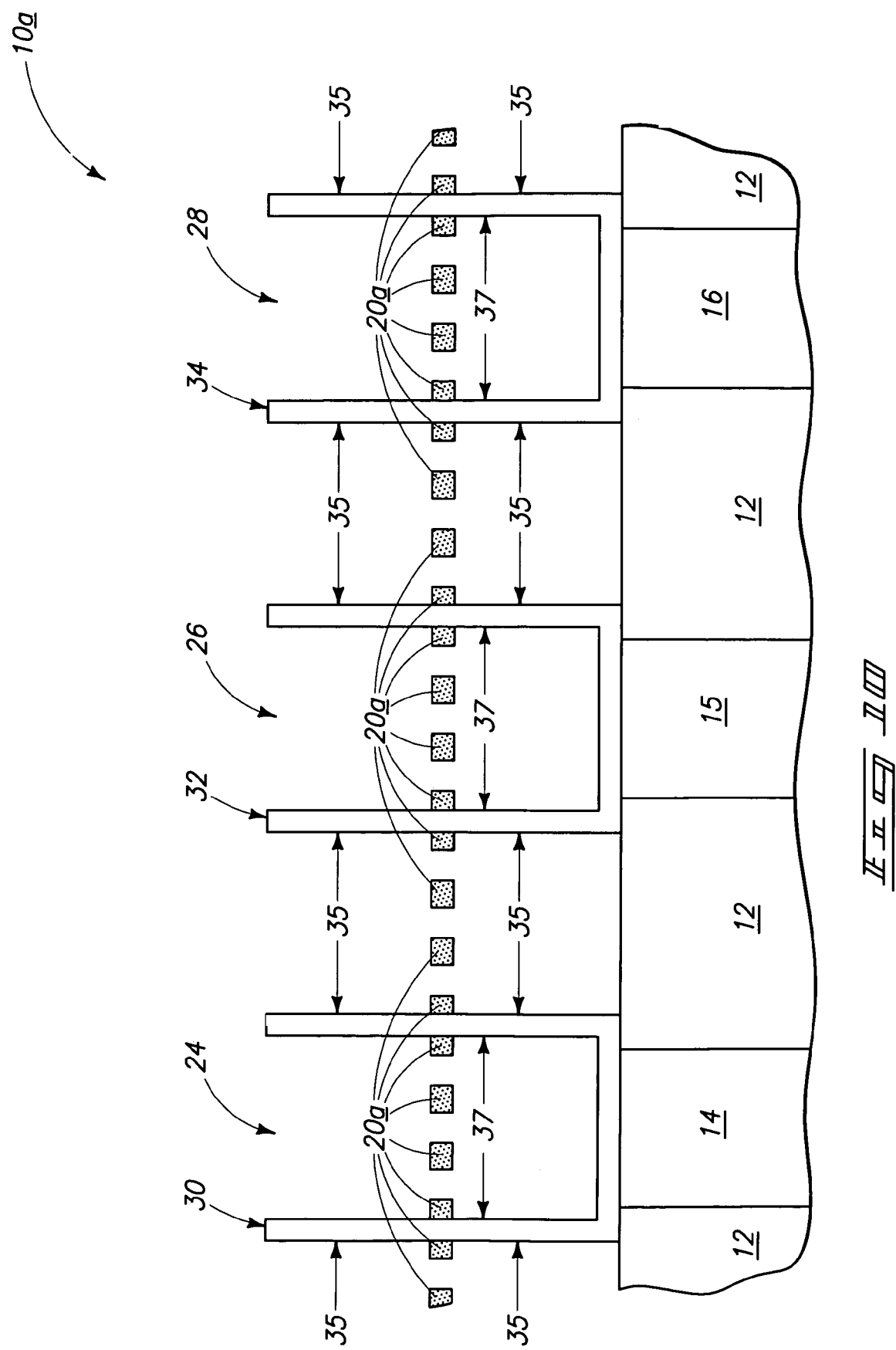
FIG. 10 is a diagrammatic cross section of an alternate embodiment substrate fragment in process in accordance with an aspect of the invention.

The above exemplary preferred embodiment depicts retaining structure 20 in FIG. 5, for example, as not being received within container openings of the preferred container shapes. By way of example only in a lesser preferred embodiment, the invention contemplates providing of the retaining structure within container openings of a container shape. For example and by way of example only, FIG. 10 depicts an alternate embodiment substrate fragment 10*a* as compared to that depicted in FIG. 5. Like numerals from the first-described embodiment are utilized where appropriate, with differences being indicated with the suffix "a" or with different numerals. FIG. 10 depicts a retaining structure/fluid previous material 20*a* having portions received within the depicted container electrodes 30, 32 and 34. Typically, such would preferably be provided, at least in part, after forming capacitor electrodes 30, 32 and 34.

Figure 11:
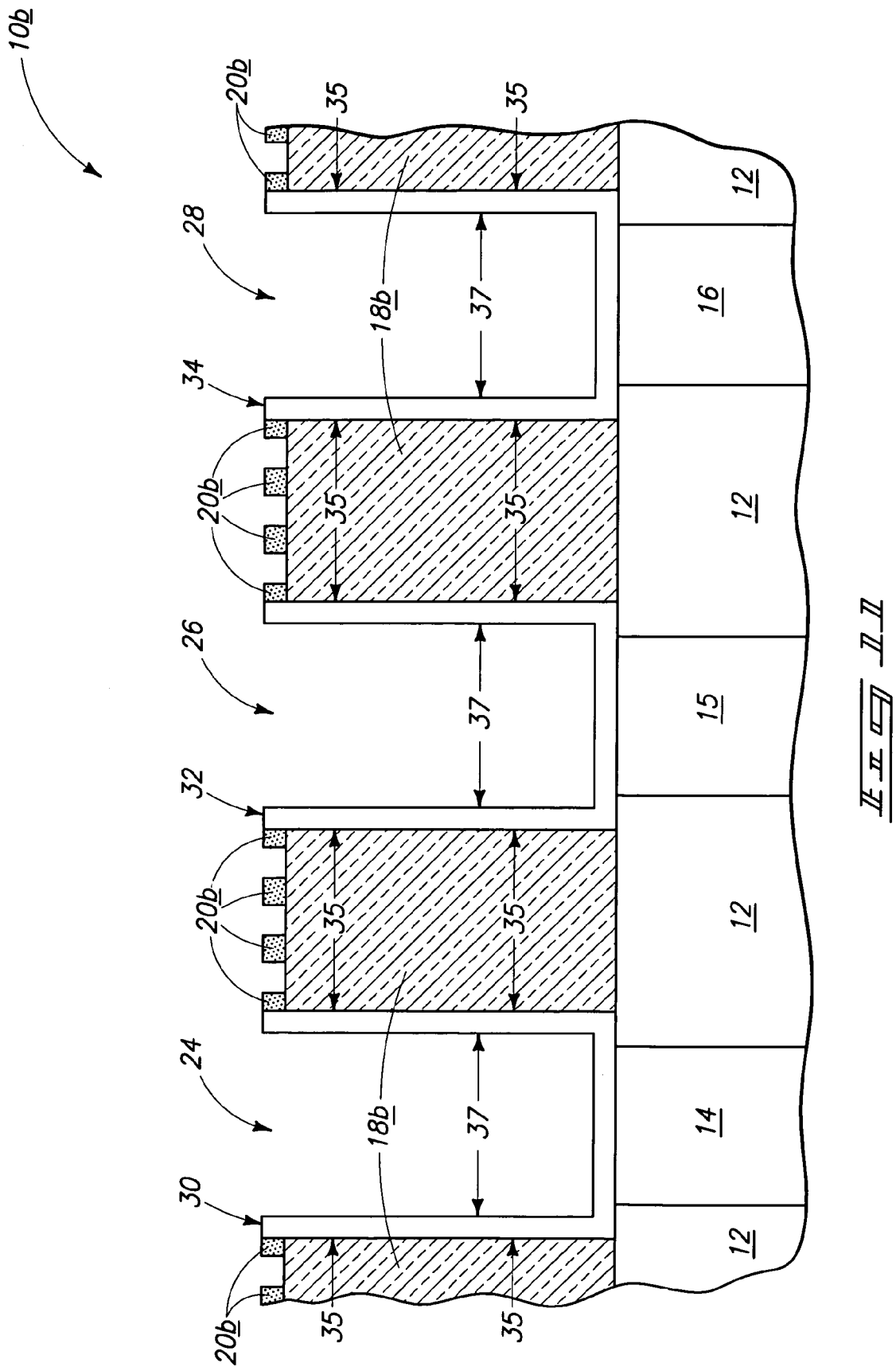
FIG. 11 is a diagrammatic cross section of another alternate embodiment substrate fragment in process in accordance with an aspect of the invention.

The above-described preferred embodiments also depict the formation of both of first and second materials 18 and 22. By way of example only, FIG. 11 depicts an alternate embodiment substrate fragment 10*b*. Like numerals from the first-described embodiments are utilized where appropriate, with differences being indicated with the suffix "b" or with different numerals. FIG. 11 depicts a processing and construction void of second material 22, whereby a thicker first layer 18*b* has been provided prior to the deposition of a fluid previous material/retaining structure 20*b*.

Aspects of the invention also contemplate integrated circuitry independent or regardless of the above-described methods of fabrication. In one implementation, such integrated circuitry comprises a plurality of spaced, elongated and upright first capacitor electrodes received over a substrate and supported at least in part by a sidewall retaining structure. By way of example only, capacitor electrodes 30, 32 and 34 are an exemplary depiction of preferred such capacitor electrodes. Further by way of example only in such exemplary implementation, retaining structure 20 is an exemplary such sidewall retaining structure. In such implementation, the sidewall retaining structure comprises a fluid previous material. Preferred materials and other attributes are otherwise as described above with all the respective described and depicted embodiments.

Aspects of the invention also contemplate methods of forming a plurality of capacitors independent or regardless of the use of fluid previous materials or layers. In one exemplary such implementation and aspect, such an implementation comprises depositing a first material over a substrate. By way of example only, all aspects associated with first material 18/18*b* described above apply. A support material comprising at least one of nanotubes and nanowhiskers is deposited over the first material, and whereby the first material is selectively etchable relative to the support material and, as just stated, independent of whether the support material is fluid previous. Exemplary preferred nanotube and nanowhisker material and attributes are otherwise as described above.

A plurality of spaced capacitor electrode openings is formed into the first and support materials and a plurality of capacitor electrodes is formed within the openings, for example as described above. After forming the plurality of capacitor electrodes, the first material is etched selectively relative to the support material effective to expose the outer lateral sidewalls of the capacitor electrodes below the support material and leaving at least some of such support material at least in part supporting the plurality of capacitors, for example as described in the above embodiments and and/but independent of whether the support material is fluid previous. Capacitor dielectric material and capacitor electrode material are thereafter deposited over at least some of the outer lateral sidewalls below the support material exposed by the etching. Such a method in one aspect also contemplates the utilization of first and second materials below and above, respectively, the support material as described in the above exemplary preferred embodiments and independent of whether the support material is fluid previous.

Further in one implementation, the invention contemplates integrated circuitry independent or regardless of the presence of fluid previous material. In such implementation, such integrated circuitry comprises a plurality of spaced, elongated and upright capacitor electrodes received over a substrate and supported at least in part by a sidewall retaining structure where such structure comprises at least one of nanowhiskers and nanotubes independent of fluid permeability through nanowhisker and/or nanotube material. Preferred attributes are otherwise as describe above, by way of example only.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a plurality of capacitors, comprising:
   providing a plurality of capacitor electrodes comprising sidewalls;
   supporting the plurality of capacitor electrodes at least in part with a retaining structure which engages the sidewalls, the retaining structure comprising a fluid previous material having plural fluid passageways;
   depositing a capacitor dielectric material over the capacitor electrodes through the fluid previous material of the retaining structure effective to deposit capacitor dielectric material over portions of the sidewalls received below the retaining structure; and
   depositing capacitor electrode material over the capacitor dielectric material through the fluid previous material of the retaining structure effective to deposit capacitor electrode material over at least some of the capacitor dielectric material received below the retaining structure.

2. The method of claim 1 wherein individual of the capacitor electrodes comprises a container shape.

3. The method of claim 2 wherein the retaining structure is not received within container openings of the container shape, and said sidewalls comprise outer lateral sidewalls.

4. The method of claim 2 wherein the retaining structure is received within container openings of the container shape.

5. The method of claim 1 wherein the sidewalls of the capacitor electrodes include portions received above the retaining structure.

6. The method of claim 1 wherein the supporting structure comprises depositing the fluid previous material, the fluid impervious material being inherently fluid previous as-deposited.

7. The method of claim 1 wherein the supporting structure comprises depositing the fluid perilous material, and further comprising increasing degree of fluid permeability of at lent some of the fluid previous material from its as-deposited state.

8. The method of claim 7 comprising increasing, from as-deposited state, degree of fluid permeability of first regions of fluid previous material that are spaced farther from the sidewalls as compared to second regions of fluid previous material that are spaced closer to the sidewalls.

9. The method of claim 8 wherein the capacitor dielectric material deposits onto the retaining structure, the capacitor dielectric material blocking fluid permeability in at least a majority of the second regions but not in a majority of the first regions.

10. The method of claim 1 wherein at least a majority of the fluid passageways within the fluid previous material have average open cross sectional dimensions no greater than 400 Angstroms.

11. The method of claim 1 wherein at least a majority of the fluid passageways within the fluid previous material have average open cross sectional dimensions no greater than 200 Angstroms.

12. The method of claim 1 wherein at least a majority of the fluid passageways within the fluid previous material have average open cross sectional dimensions of from 50 Angstroms to 400 Angstroms.

13. The method of claim 1 wherein at least a majority of the fluid passageways within the fluid previous material have average open cross sectional dimensions of from 100 Angstroms to 300 Angstroms.

14. The method of claim 1 wherein the capacitor dielectric material deposits onto the retaining structure.

15. The method of claim 1 wherein the capacitor electrode material deposits onto the retaining structure.

16. The method of claim 1 wherein the retaining structure remains as part of a finished integrated circuitry construction incorporating the plurality of capacitors.

17. The method of claim 1 wherein the fluid previous material comprises a cellular solid.

18. The method of claim 17 wherein the cellular solid comprises a honeycomb.

19. The method of claim 17 wherein the cellular solid comprises a foam.

20. The method of claim 1 wherein the fluid previous material is porous.

21. The method of claim 20 wherein the fluid previous material is nanoporous.

22. The method of claim 20 wherein the fluid previous material is low k.

23. The method of claim 1 wherein the fluid previous material comprises nanowhiskers.

24. The method of claim 1 wherein the fluid previous material comprises nanotubes.

25. The method of claim 1 wherein the fluid perilous material comprises a spin-on-glass having nanowhiskers received therein.

26. The method of claim 1 wherein the fluid previous material comprises a spin-on-glass having nanotubes received therein.

27. A method of forming a plurality of capacitors, comprising:

providing a plurality of capacitor electrodes comprising sidewalls, portions of the sidewalls being received above and below the retaining structure;

supporting the plurality of capacitor electrodes at least in part with a deposited retaining structure which engages the sidewalls, the retaining structure comprising a fluid previous material comprising plural fluid passageways and which is inherently fluid previous as-deposited, at least a majority of the fluid passageways within the fluid previous material having average open cross sectional dimensions no greater than 400 Angstroms;

depositing a capacitor dielectric material over the capacitor electrodes through the fluid previous material of the retaining structure effective to deposit capacitor dielectric material over portions of the sidewalls received below the retaining structure, the capacitor dielectric material depositing onto the retaining structure; and depositing capacitor electrode material over the capacitor dielectric material through the fluid previous material of the retaining structure effective to deposit capacitor electrode material over at least some of the capacitor dielectric material received below the retaining structure, the retaining structure remaining as part of a finished integrated circuitry construction incorporating the plurality of capacitors.

28. The method of claim 27 wherein at least a majority of the fluid passageways within the fluid previous material have average open cross sectional dimensions of from 100 Angstroms to 300 Angstroms.

29. The method of claim 27 comprising increasing degree of fluid permeability of at least some of the fluid previous material from its as-deposited state.

30. The method of claim 27 comprising increasing, from as-deposited state, degree of fluid permeability of first regions of fluid previous material that are spaced farther from the sidewalls as compared to second regions of fluid previous material that are spaced closer to the sidewalls.

31. The method of claim 30 wherein the capacitor dielectric material blocks fluid permeability in at least a majority of the second regions but not in a majority of the first regions.

32. The method of claim 27 wherein the fluid previous material comprises a cellular solid.

33. The method of claim 27 wherein the fluid previous material comprises nanowhiskers.

34. The method of claim 27 wherein the fluid previous material comprises nanotubes.

35. A method of farming a plurality of capacitors, comprising:

depositing a first material over a substrate;

depositing a fluid previous material having plural fluid passageways over the first material, the first material being selectively etchable relative to the fluid previous material;

forming a plurality of spaced capacitor electrode openings into the first and fluid previous materials;

forming a plurality of capacitor electrodes within the openings;

after forming the plurality of capacitor electrodes, flowing an etching fluid through the fluid previous material effective to selectively etch first material relative to the fluid previous material and effective to expose outer lateral sidewalls of the capacitor electrodes below the fluid previous material; and after the selective etch, depositing capacitor dielectric material and capacitor electrode material over at least some of the outer lateral sidewalls below the fluid previous material exposed by the selective etch.

36. The method of claim 35 wherein the fluid previous material supports the capacitor electrodes upright during said selective etch.

37. The method of claim 35 wherein the fluid impervious material is inherently fluid previous as-deposited.

38. The method of claim 37 comprising increasing degree of fluid permeability of at least some of the fluid previous material from its as-deposited state.

39. The method of claim 35 comprising after forming the plurality of capacitors increasing, from as-deposited state, degree of fluid permeability of first regions of fluid previous material that are spaced farther from the sidewalls as compared to second regions of fluid previous material that are spaced closer to the sidewalls.

40. The method of claim 39 wherein the capacitor dielectric material deposits onto the fluid previous material, the capacitor dielectric material blocking fluid permeability in at least a majority of the second regions but not In a majority of the first regions.

41. The method of claim 35 wherein at least a majority of the fluid passageways within the fluid previous material have average open cross sectional dimensions no greater than 400 Angstroms.

42. The method of claim 35 wherein at least a majority of the fluid passageways within the fluid previous material have average open cross sectional dimensions no greater than 200 Angstroms.

43. The method of claim 35 wherein the fluid previous material remains as part of a finished integrated circuitry construction incorporating the plurality of capacitors.

44. The method of claim 35 wherein the fluid previous material comprises a cellular solid.

45. The method of claim 44 wherein the cellular solid comprises a honeycomb.

46. The method of claim 44 wherein the cellular solid comprises a foam.

47. The method of claim 35 wherein the fluid perilous material is porous.

48. The method of claim 47 wherein the fluid perilous material is nanoporous.

49. The method of claim 47 wherein the fluid previous material is low k.

50. The method of claim 35 wherein the fluid previous material comprises nanowhiskers.

51. The method of claim 35 wherein the fluid previous material comprises nanotubes.

52. The method of claim 35 wherein the depositing of the fluid previous material comprises:

providing nanowhiskers within a spin-on-glass solution;

depositing the solution over the first material; and solidifying the solution into material comprising spin-on-glass and nanowhiskers.

53. The method of claim 35 wherein the depositing of the fluid previous material comprises:

providing nanotubes within a spin-on-glass solution;

depositing the solution over the first material; and solidifying the solution into material comprising spin-on-glass and nanotubes.

54. A method of forming a plurality of capacitors, comprising:
   depositing a first material over a substrate;
   depositing a fluid previous material having plural fluid passageways over the first material, the first material being selectively etchable relative to the fluid previous material;
   depositing a second material over the fluid previous material, the second material being selectively etchable relative to the fluid previous material;
   forming a plurality of spaced capacitor electrode openings into the first, fluid previous, and second materials;
   forming a plurality of capacitor electrodes within the openings;
   after forming the plurality of capacitor electrodes, etching the second material selectively relative to the fluid previous material effective to expose outer lateral sidewalls of the capacitor electrodes above the fluid previous material;
   after etching the second material, flowing an etching fluid through the fluid previous material effective to selectively etch first material relative to the fluid previous material and effective to expose outer lateral sidewalls of the capacitor electrodes below the fluid previous material; and
   after the selective etch of the first material, depositing capacitor dielectric material and capacitor electrode material over at least some of the outer lateral sidewalls above and below the fluid previous material.

55. The method of claim 54 wherein the first and second materials are different.

56. The method of claim 55 wherein the first and second materials comprise oxides.

57. The method of claim 54 wherein the first and second materials are the same.

58. The method of claim 54 wherein the second and first materials are selectively etched relative to the fluid previous material using the same etching fluid.

59. The method of claim 54 wherein the second and first materials are selectively etched relative to the fluid previous material using the same etching fluid and in a single common, continuous etching step.

60. The method of claim 54 wherein the fluid perilous material supports the capacitor electrodes upright during said selective etch of the first material.

61. The method of claim 54 wherein the fluid previous material comprises a cellular solid.

62. The method of claim 61 wherein the cellular solid comprises a honeycomb.

63. The method of claim 61 wherein the cellular solid comprises a foam.

64. The method of claim 54 wherein the fluid previous material is porous.

65. The method of claim 64 wherein the fluid previous material is nanoporous.

66. The method of claim 64 wherein the fluid previous material is low k.

67. The method of claim 54 wherein the fluid previous material comprises nanowhiskers.

68. The method of claim 54 wherein the fluid previous material comprises nanotubes.

69. The method of claim 54 wherein the depositing of the fluid previous material comprises:
   providing nanowhiskers within a spin-on-glass solution;
   depositing the solution over the first material; and
   solidifying the solution into material comprising spin-on-glass and nanowhiskers.

70. The method of claim 54 wherein the depositing of the fluid previous material comprises:
   providing nanotubes within a spin-on-glass solution;
   depositing the solution over the first material; and
   solidifying the solution into material comprising spin-on-glass and nanotubes.

71. The method of claim 54 wherein the fluid impervious material is inherently fluid previous as-deposited.

72. The method of claim 71 comprising increasing degree of fluid permeability of at least some of the fluid previous material from its as-deposited state.

73. The method of claim 54 comprising after forming the plurality of capacitors increasing, from as-deposited state, degree of fluid permeability of first regions of fluid previous material that are spaced farther from the sidewalls as compared to second regions of fluid previous material that are spaced closer to the sidewalls.

74. The method of claim 73 wherein the capacitor dielectric material deposits onto the fluid previous material, the capacitor dielectric material blocking fluid permeability in at least a majority of the second regions but not in a majority of the first regions.

75. The method of claim 54 wherein at least a majority of the fluid passageways within the fluid previous material have average open cross sectional dimensions no greater than 400 Angstroms.

76. The method of claim 54 wherein at least a majority of the fluid passageways within the fluid previous material have average open cross sectional dimensions no greater than 200 Angstroms.

77. The method of claim 54 wherein the fluid previous material remains as part of a finished integrated circuitry construction incorporating the plurality of capacitors.

78. The method of claim 54 wherein the second material is deposited on the fluid previous material, the second material filling at least a portion of at least some of fluid passageways of the fluid previous material.

79. The method of claim 78 wherein the second material fills all of at least some of the fluid passageways of the fluid previous material.

80. The method of claim 79 wherein the second material fills all of at least a majority of the fluid passageways of the fluid previous material.

81. A method of forming a plurality of capacitors comprising:
   depositing a first material over a substrate;
   depositing a support material comprising at least one of nanotubes and nanowhiskers over the first material, the first material being selectively etchable relative to the support material;
   forming a plurality of spaced capacitor electrode openings into the first and support materials;
   forming a plurality of capacitor electrodes within the openings;
   after forming the plurality of capacitor electrodes, etching the first material selectively relative to the support material effective to expose outer lateral sidewalls of the capacitor electrodes below the support material and leaving at least some of said support material at least in part supporting said plurality of capacitors; and
   after said etching, depositing capacitor dielectric material and capacitor electrode material over at least some of the outer lateral sidewalls below the support material exposed by said etching.

82. A method of forming a plurality of capacitors, comprising:
- depositing a first material over a substrate;
- depositing a support material comprising at least one nanotubes and nanowhiskers over the first material, the first material being selectively etchable relative to the support material;
- depositing a second material over the support material, the second material being selectively etchable relative to the support material;
- forming a plurality of spaced capacitor electrode openings into the first, support, and second materials;
- forming a plurality of capacitor electrodes within the openings;
- after forming the plurality of capacitor electrodes, etching the second material selectively relative to the support material effective to expose outer lateral sidewalls of said plurality of capacitor electrodes above the support material;
- after etching the second material, etching the first material selectively relative to the support material effective to expose outer lateral sidewalls of said plurality of capacitor electrodes below the support material and leaving at least some of said support material at least in part supporting said plurality of capacitor electrodes; and
- after said etching of the first material, depositing capacitor dielectric material and capacitor electrode material below the support material over at least some of the outer lateral sidewalls exposed by said etching of the first material.

* * * * *

UNITED STATES PATENT AND TRADEMARK OFFICE
CERTIFICATE OF CORRECTION

PATENT NO.       : 7,320,911 B2
APPLICATION NO.  : 11/006331
DATED            : January 22, 2008
INVENTOR(S)      : Basceri et al.

It is certified that error appears in the above-identified patent and that said Letters Patent is hereby corrected as shown below:

On the Title page, in field (57), under "Abstract", in column 2, line 6, delete "previous" and insert -- pervious --, therefor.

On the Title page, in field (57), under "Abstract", in column 2, line 8, delete "previous" and insert -- pervious --, therefor.

On the Title page, in field (57), under "Abstract", in column 2, line 12, delete "previous" and insert -- pervious --, therefor.

In column 9, lines 50-51, in Claim 1, delete "previous" and insert -- pervious --, therefor.

In column 9, line 53, in Claim 1, delete "previous" and insert -- pervious --, therefor.

In column 9, line 58, in Claim 1, delete "previous" and insert -- pervious --, therefor.

In column 10, line 7, in Claim 6, delete "previous" and insert -- pervious --, therefor.

In column 10, line 8, in Claim 6, delete "previous" and insert -- pervious --, therefor.

In column 10, line 11, in Claim 7, delete "perilous" and insert -- pervious --, therefor.

In column 10, line 12, in Claim 7, delete "lent" and insert -- least --, therefor.

In column 10, line 13, in Claim 7, delete "previous" and insert -- pervious --, therefor.

In column 10, line 17, in Claim 8, delete "previous" and insert -- pervious --, therefor.

In column 10, line 19, in Claim 8, delete "previous" and insert -- pervious --, therefor.

In column 10, line 26, in Claim 10, delete "previous" and insert -- pervious --, therefor.

In column 10, line 30, in Claim 11, delete "previous" and insert -- pervious --, therefor.

In column 10, line 34, in Claim 12, delete "previous" and insert -- pervious --, therefor.

In column 10, line 39, in Claim 13, delete "previous" and insert -- pervious --, therefor.

In column 10, line 49, in Claim 17, delete "previous" and insert -- pervious --, therefor.

In column 10, line 55, in Claim 20, delete "previous" and insert -- pervious --, therefor.

UNITED STATES PATENT AND TRADEMARK OFFICE
CERTIFICATE OF CORRECTION

PATENT NO.        : 7,320,911 B2
APPLICATION NO.   : 11/006331
DATED             : January 22, 2008
INVENTOR(S)       : Basceri et al.

It is certified that error appears in the above-identified patent and that said Letters Patent is hereby corrected as shown below:

In column 10, line 57, in Claim 21, delete "previous" and insert -- pervious --, therefor.

In column 10, line 59, in Claim 22, delete "previous" and insert -- pervious --, therefor.

In column 10, line 61, in Claim 23, delete "previous" and insert -- pervious --, therefor.

In column 10, line 63, in Claim 24, delete "previous" and insert -- pervious --, therefor.

In column 10, line 65, in Claim 25, delete "perilous" and insert -- pervious --, therefor.

In column 11, line 1, in Claim 26, delete "previous" and insert -- pervious --, therefor.

In column 11, line 12, in Claim 27, delete "previous" and insert -- pervious --, therefor.

In column 11, line 13, in Claim 27, delete "previous" and insert -- pervious --, therefor.

In column 11, line 15, in Claim 27, delete "previous" and insert -- pervious --, therefor.

In column 11, line 18, in Claim 27, delete "previous" and insert -- pervious --, therefor.

In column 11, line 24, in Claim 27, delete "previous" and insert -- pervious --, therefor.

In column 11, line 32, in Claim 28, delete "previous" and insert -- pervious --, therefor.

In column 11, line 36, in Claim 29, delete "previous" and insert -- pervious --, therefor.

In column 11, line 40, in Claim 30, delete "previous" and insert -- pervious --, therefor.

In column 11, line 42, in Claim 30, delete "previous" and insert -- pervious --, therefor.

In column 11, line 47, in Claim 32, delete "previous" and insert -- pervious --, therefor.

In column 11, line 49, in Claim 33, delete "previous" and insert -- pervious --, therefor.

In column 11, line 51, in Claim 34, delete "previous" and insert -- pervious --, therefor.

In column 11, line 53, in Claim 35, delete "farming" and insert -- forming --, therefor.

In column 11, line 56, in Claim 35, delete "previous" and insert -- pervious --, therefor.

In column 11, line 58, in Claim 35, delete "previous" and insert -- pervious --, therefor.

UNITED STATES PATENT AND TRADEMARK OFFICE
CERTIFICATE OF CORRECTION

PATENT NO. : 7,320,911 B2
APPLICATION NO. : 11/006331
DATED : January 22, 2008
INVENTOR(S) : Basceri et al.

It is certified that error appears in the above-identified patent and that said Letters Patent is hereby corrected as shown below:

In column 11, line 61, in Claim 35, delete "previous" and insert -- pervious --, therefor.

In column 11, line 65, in Claim 35, delete "previous" and insert -- pervious --, therefor.

In column 11, line 67, in Claim 35, delete "previous" and insert -- pervious --, therefor.

In column 12, line 2, in Claim 35, delete "previous" and insert -- pervious --, therefor.

In column 12, line 6, in Claim 35, delete "previous" and insert -- pervious --, therefor.

In column 12, line 7, in Claim 36, delete "previous" and insert -- pervious --, therefor.

In column 12, line 11, in Claim 37, delete "previous" and insert -- pervious --, therefor.

In column 12, line 13, in Claim 38, delete "previous" and insert -- pervious --, therefor.

In column 12, line 18, in Claim 39, delete "previous" and insert -- pervious --, therefor.

In column 12, line 20, in Claim 39, delete "previous" and insert -- pervious --, therefor.

In column 12, line 23, in Claim 40, delete "previous" and insert -- pervious --, therefor.

In column 12, line 25, in Claim 40, delete "In" and insert -- in --, therefor.

In column 12, line 28, in Claim 41, delete "previous" and insert -- pervious --, therefor.

In column 12, line 32, in Claim 42, delete "previous" and insert -- pervious --, therefor.

In column 12, line 35, in Claim 43, delete "previous" and insert -- pervious --, therefor.

In column 12, line 38, in Claim 44, delete "previous" and insert -- pervious --, therefor.

In column 12, line 44, in Claim 47, delete "perilous" and insert -- pervious --, therefor.

In column 12, line 46, in Claim 48, delete "perilous" and insert -- pervious --, therefor.

In column 12, line 49, in Claim 49, delete "previous" and insert -- pervious --, therefor.

UNITED STATES PATENT AND TRADEMARK OFFICE
CERTIFICATE OF CORRECTION

PATENT NO. : 7,320,911 B2
APPLICATION NO. : 11/006331
DATED : January 22, 2008
INVENTOR(S) : Basceri et al.

It is certified that error appears in the above-identified patent and that said Letters Patent is hereby corrected as shown below:

In column 12, line 51, in Claim 50, delete "previous" and insert -- pervious --, therefor.

In column 12, line 53, in Claim 51, delete "previous" and insert -- pervious --, therefor.

In column 12, line 56, in Claim 52, delete "previous" and insert -- pervious --, therefor.

In column 12, line 63, in Claim 53, delete "previous" and insert -- pervious --, therefor.

In column 13, line 4, in Claim 54, delete "previous" and insert -- pervious --, therefor.

In column 13, line 6, in Claim 54, delete "previous" and insert -- pervious --, therefor.

In column 13, line 8, in Claim 54, delete "previous" and insert -- pervious --, therefor.

In column 13, line 10, in Claim 54, delete "previous" and insert -- pervious --, therefor.

In column 13, line 12, in Claim 54, delete "previous" and insert -- pervious --, therefor.

In column 13, line 17, in Claim 54, delete "previous" and insert -- pervious --, therefor.

In column 13, lines 18-19, in Claim 54, delete "previous" and insert -- pervious --, therefor.

In column 13, line 21, in Claim 54, delete "previous" and insert -- pervious --, therefor.

In column 13, line 22, in Claim 54, delete "previous" and insert -- pervious --, therefor.

In column 13, line 24, in Claim 54, delete "previous" and insert -- pervious --, therefor.

In column 13, line 29, in Claim 54, delete "previous" and insert -- pervious --, therefor.

In column 13, line 37, in Claim 58, delete "previous" and insert -- pervious --, therefor.

In column 13, line 40, in Claim 59, delete "previous" and insert -- pervious --, therefor.

In column 13, line 43, in Claim 60, delete "perilous" and insert -- pervious --, therefor.

In column 13, line 46, in Claim 61, delete "previous" and insert -- pervious --, therefor.

UNITED STATES PATENT AND TRADEMARK OFFICE
CERTIFICATE OF CORRECTION

PATENT NO.         : 7,320,911 B2
APPLICATION NO.    : 11/006331
DATED              : January 22, 2008
INVENTOR(S)        : Basceri et al.

It is certified that error appears in the above-identified patent and that said Letters Patent is hereby corrected as shown below:

In column 13, line 52, in Claim 64, delete "previous" and insert -- pervious --, therefor.

In column 13, line 54, in Claim 65, delete "previous" and insert -- pervious --, therefor.

In column 13, line 56, in Claim 66, delete "previous" and insert -- pervious --, therefor.

In column 13, line 58, in Claim 67, delete "previous" and insert -- pervious --, therefor.

In column 13, line 60, in Claim 68, delete "previous" and insert -- pervious --, therefor.

In column 13, line 63, in Claim 69, delete "previous" and insert -- pervious --, therefor.

In column 14, line 2, in Claim 70, delete "previous" and insert -- pervious --, therefor.

In column 14, line 9, in Claim 71, delete "previous" and insert -- pervious --, therefor.

In column 14, line 11, in Claim 72, delete "previous" and insert -- pervious --, therefor.

In column 14, line 15, in Claim 73, delete "previous" and insert -- pervious --, therefor.

In column 14, line 17, in Claim 73, delete "previous" and insert -- pervious --, therefor.

In column 14, line 20, in Claim 74, delete "previous" and insert -- pervious --, therefor.

In column 14, line 25, in Claim 75, delete "previous" and insert -- pervious --, therefor.

In column 14, line 30, in Claim 76, delete "previous" and insert -- pervious --, therefor.

In column 14, line 33, in Claim 77, delete "previous" and insert -- pervious --, therefor.

In column 14, line 37, in Claim 78, delete "previous" and insert -- pervious --, therefor.

In column 14, line 38, in Claim 78, insert -- the --, before "fluid".

In column 14, line 39, in Claim 78, delete "previous" and insert -- pervious --, therefor.

UNITED STATES PATENT AND TRADEMARK OFFICE
CERTIFICATE OF CORRECTION

PATENT NO.      : 7,320,911 B2
APPLICATION NO. : 11/006331
DATED           : January 22, 2008
INVENTOR(S)     : Basceri et al.

It is certified that error appears in the above-identified patent and that said Letters Patent is hereby corrected as shown below:

In column 14, line 42, in Claim 79, delete "previous" and insert -- pervious --, therefor.

In column 14, line 45, in Claim 80, delete "previous" and insert -- pervious --, therefor.

Signed and Sealed this

Twenty-seventh Day of May, 2008

JON W. DUDAS
*Director of the United States Patent and Trademark Office*